US010685754B2

(12) United States Patent
Lahoda et al.

(10) Patent No.: US 10,685,754 B2
(45) Date of Patent: Jun. 16, 2020

(54) INTEGRATION OF REAL-TIME MEASUREMENTS AND ATOMISTIC MODELING TO LICENSE NUCLEAR COMPONENTS

(71) Applicant: WESTINGHOUSE ELECTRIC COMPANY, LLC, Cranberry Township, PA (US)

(72) Inventors: Edward J. Lahoda, Edgewood, PA (US); Sumit Ray, Columbia, SC (US)

(73) Assignee: Westinghouse Electric Company LLC, Cranberry Township, PA (US)

(*) Notice: Subject to any disclaimer, the term of this patent is extended or adjusted under 35 U.S.C. 154(b) by 216 days.

(21) Appl. No.: 15/451,643

(22) Filed: Mar. 7, 2017

(65) Prior Publication Data

US 2018/0174695 A1 Jun. 21, 2018

Related U.S. Application Data

(60) Provisional application No. 62/434,530, filed on Dec. 15, 2016.

(51) Int. Cl.
*G21D 3/00* (2006.01)
*G06F 30/20* (2020.01)
*G21D 3/04* (2006.01)
*G21C 17/00* (2006.01)

(52) U.S. Cl.
CPC ............ *G21D 3/001* (2013.01); *G06F 30/20* (2020.01); *G21D 3/04* (2013.01); *G21C 17/00* (2013.01); *Y02E 30/40* (2013.01)

(58) Field of Classification Search
CPC combination set(s) only.
See application file for complete search history.

(56) References Cited

U.S. PATENT DOCUMENTS 6,535,568 B1 * 3/2003 Reese .................... G21D 3/001
376/245
10,319,484 B1 * 6/2019 Reyes, Jr. ............ G21C 17/003
2003/0004679 A1 1/2003 Tryon, III et al.
(Continued)

FOREIGN PATENT DOCUMENTS

EP 1936635 A2 6/2008
JP 2006189442 A 7/2006

OTHER PUBLICATIONS

Stan, Marius "Discovery and design of nuclear fuels," Materials Today vol. 12 No. 11 pp. 20-28 (2009) (Year: 2009).*
(Continued)

*Primary Examiner* — Rehana Perveen
*Assistant Examiner* — Steven W Crabb
(74) *Attorney, Agent, or Firm* — K&L Gates LLP

(57) ABSTRACT

An improved testing and data gathering method is described herein with reference to testing a new fuel, as an exemplary component to be tested for licensure purposes. The method includes generally: generating models for the new system; making samples and getting them accepted for a reactor; and testing the samples in a test or commercial reactor until the exposure time is reached for the expected cycle length of the fuel at final use. The method is preferably done concurrent to submitting a license application for commercial use of the new component to the relevant government body to expedite license testing review.

6 Claims, 1 Drawing Sheet

(56) References Cited

U.S. PATENT DOCUMENTS

| | | | | |
|---|---|---|---|---|
| 2004/0079164 A1* | 4/2004 | Choe | ............ | G01N 3/32 |
| | | | | 73/808 |
| 2006/0149515 A1* | 7/2006 | Horton | ............ | G21C 7/36 |
| | | | | 703/6 |
| 2007/0213959 A1* | 9/2007 | Kropaczek | ............ | G21C 17/00 |
| | | | | 703/1 |
| 2010/0260300 A1 | 10/2010 | Poyaud et al. | | |
| 2013/0173233 A1 | 7/2013 | Cheatham, III et al. | | |

OTHER PUBLICATIONS

Vane, Z., "The Use of Computer Modeling in Reactor Design" Stanford University, pp. 1-3, Mar. 21, 2012 (Year: 2012).*

I.L.F. Ray; An electron microscopy study of the RIM structure of a UO2 fuel with a high burnup of 7.9% FIMA; Journal of Nuclear Materials 245; 1997; pp. 115-123; Elsevier Science.

G. Martin; Effect of the cascade energy on defect production in uranium dioxide; Nuclear Instruments and Methods in Physics Research (2011); pp. 1727-1730; Elsevier.

D.A. Andersson; Atomistic modeling of intrinsic and radiation-enhanced fission gas (Xe) diffusion in UO 2+x: Implications for nuclear fuel performance modeling; Journal of Nuclear Materials 451 (2014); pp. 225-242; Elsevier.

S. C. Middleburgh; Non-stoichiometry in U3Si2; Journal of Nuclear Materials 482 (2016); pp. 300-305; Elsevier.

Michel Freyss; Multiscale Modelling of Nuclear Fuels under Irradiation (Abstract); MINOS—Workshop Materials Innovation for Nuclear Optimized Systems; Dec. 5-7, 2012, CEA-INSTN Saclay, France; pp. 1-3.

M. Freyss; Multiscale Modelling of Nuclear Fuels Under Irradiation (Presentation); MINOS—Workshop, Materials Innovation for Nuclear Optimized Systems; Dec. 5-7, 2012, CEA-INSTN Saclay, France; pp. 1-21.

K. E. Metzger; Model of U3Si2 Fuel System Using BISON fuel Code; ICAPP 2014; Paper 14343; INL Idaho National Laboratory; Charlotte, USA; pp. 1-8.

R. Shane Johnson; Nuclear Energy Advanced Modeling and Simulation; U.S. Department of Energy; Overview for NEAC Review Meeting, Dec. 19, 2013; pp. 1-18.

Markus J. Buehler; Introduction to atomistic modeling techniques: Do we need atoms to describe how materials behave?; Lecture 1; Lecture Series, CEE, Fall 2005, IAP, Spring 2006; Department of Civil & Environmental Engineering; Massachusetts Institute of Technology; pp. 1-66.

International Search Report and Written Opinion of the International Searching Authority for PCT/US2017/058650 dated Feb. 21, 2018 (Forms PCT/ISA/220, PCT/ISA/210, PCT/ISA/237).

* cited by examiner

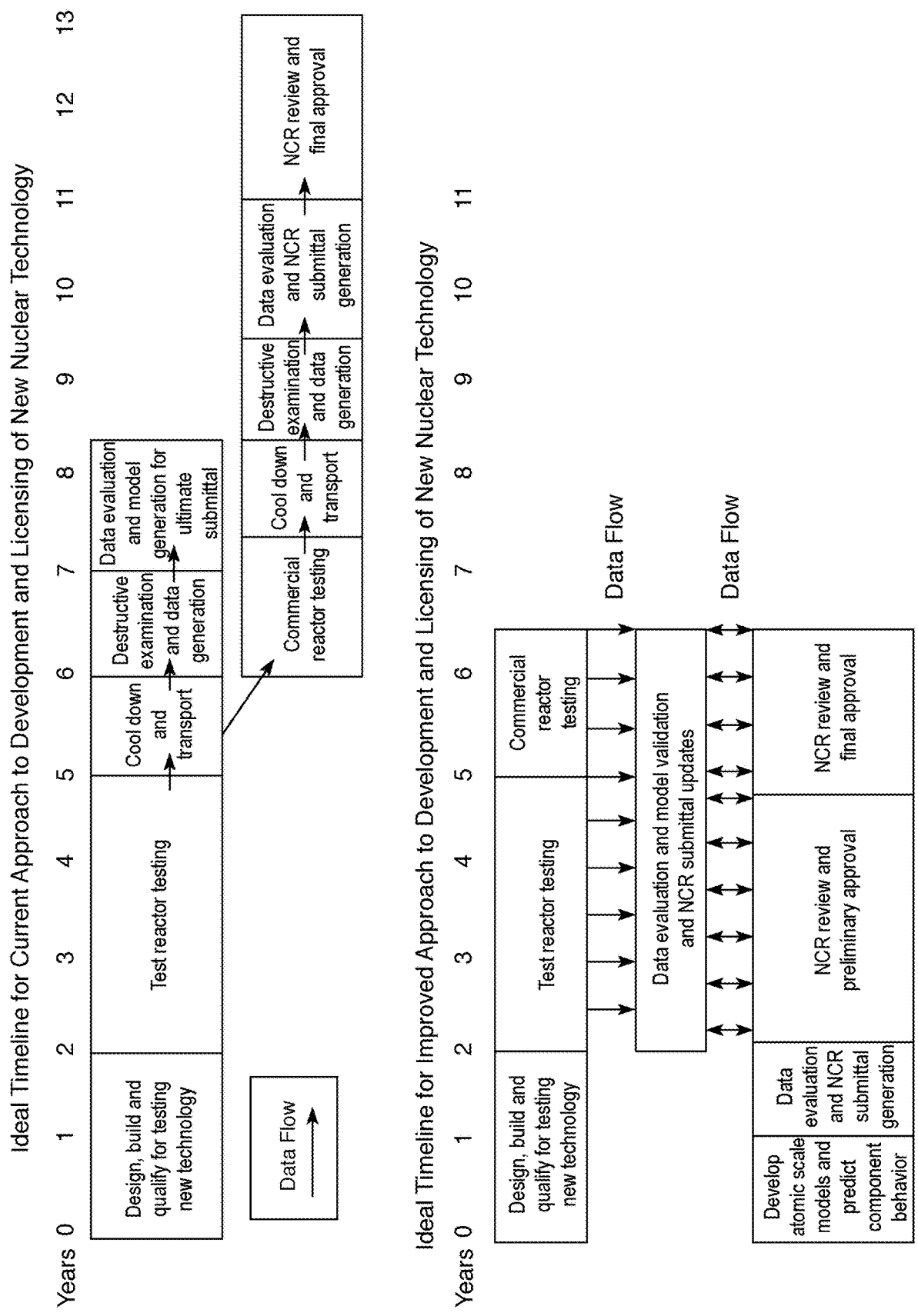

INTEGRATION OF REAL-TIME MEASUREMENTS AND ATOMISTIC MODELING TO LICENSE NUCLEAR COMPONENTS

CROSS REFERENCE TO RELATED APPLICATION

This application claims the benefit of priority from U.S. provisional patent application Ser. No. 62/434,530 filed Dec. 15, 2016, the contents of which are hereby incorporated herein by reference.

STATEMENT REGARDING GOVERNMENT RIGHTS

This invention was made with government support under Contract No. DE-NE0008222 awarded by the Department of Energy. The U.S. Government has certain rights in this invention.

BACKGROUND OF THE INVENTION

1. Field of the Invention

The present concept relates to methods for testing nuclear power facilities, and particularly to methods of obtaining real-time measurements of fuel and component behavior for meeting licensing requirements.

2. Description of the Prior Art

Under current regulations, a nuclear facility must satisfy certain standards before a license to operate the facility or to make a change in a component or the fuel used in a reactor will be issued by the controlling government authority.

For example, the current approach for obtaining a license to use a new kind of fuel requires fuel samples to be made and accepted for use in the reactor, a process that usually takes about twelve to eighteen months, and can take much longer when the new fuel to be tested is novel. Sample testing entails designing and manufacturing the test samples and performing the calculations required to allow the samples into a reactor.

Testing the samples is carried out in either a test or commercial reactor for a period of time needed to reach the exposure time for the expected cycle length of the new fuel at its final use. If the samples are in a commercial reactor, the exposure time to match the typical cycle length during which fuel is used is at least eighteen and can be twenty-four months or more. However, if the tests are carried out in a test reactor, the exposure time span may be much longer since test reactors typically are not as readily available for use (usually about 50% of the time requested) compared to the availability of a commercial reactor (usually more than 90% of the time requested). There are, however, even greater risks than loss of time in running tests in a commercial reactor, especially for highly novel concepts, because a failed experiment could potentially affect the continued operation of the reactor causing loss of revenue as high as one million dollars (US) per day and endangering the reactor as a whole.

After completion of the test cycle, the samples are removed from the reactor for examination. Before the test samples can be examined, a cooling time is required to allow the radioactivity to decay. This cooling period can be as little as 6 months or as long as 18 months depending on shipping requirements.

A post irradiation examination has to be performed to obtain data such as thermal conductivity, fuel swelling, fission gas release, and fuel melting point. In order to get the data, the samples need to be taken apart, examined and tested, taking from 3 to 6 months for completion.

After obtaining the data, the data is then correlated and used to generate empirical models that are submitted with the test data to the appropriate regulatory body. The Nuclear Regulatory Commission (NRC) in the United States, or its counterpart in other countries, reviews the submitted data and empirical models and either approves the new fuel or initiates a dialog requesting additional data. The data and models are used to demonstrate to the NRC that the operation of the fuel is understood and that there are no adverse consequences to the general population if a reactor uses the new fuel. In theory, an adequate number of samples have been initially installed in the reactor and the data from these multiple samples forms an empirical correlation that is statistically and logically acceptable to the NRC. However, this rarely happens and more often than not additional testing is required to verify data, and obtain new data to disqualify or explain data points that fall too far outside of the empirical correlation. If additional testing is required, the steps described above must be repeated, at a large additional cost and loss of time. The time associated with working with the NRC to demonstrate that a proposed new fuel is acceptable can range from a year to many years. Then, the data from multiple samples is correlated and written in a licensing report submitted to the NRC, which takes another three to six months.

The current approach to licensing nuclear fuel or any other nuclear component requires considerable time and expense.

There is a need to reduce the time required to obtain a license for a new nuclear fuel at the NRC, without sacrificing the ability to demonstrate efficacy and safety.

SUMMARY OF THE INVENTION

The problem associated with the length of time it takes to test, gather data, review and approve a new nuclear fuel or other components used in a nuclear facility to obtain a license for its use is addressed by the testing system and methods described herein.

A new approach to generating the data and in performing licensing is proposed. This approach utilizes atomistic modeling of nuclear components, such as nuclear fuel performance, to determine component (such as fuel) characteristics that predict in-reactor fuel performance combined with real-time data retrieval to provide real-time validation of the atomistic models. In various aspects, the process for use in securing a license for nuclear components may be characterized as preparing atomistic models to predict predetermined physical properties of at least a portion of a nuclear reactor component, and verifying the models with real-time data collected from samples undergoing testing in the reactor.

In various aspects, the process for use in securing a license for nuclear components may be characterized as preparing atomistic models to predict predetermined physical properties of nuclear reactor fuel over at least a portion of the expected cycle length of the fuel, and verifying the models with real-time data collected from fuel samples undergoing testing in a reactor. The real-time data may be selected from the group consisting of pressure, temperature, change in component volume, stress and strain tension, energy, heat capacities, thermal conductivity, fission gas release, fuel swelling, fuel melting point, and combinations thereof. The process may further include comparing the real-time data to the physical property model and adjusting the physical property model to conform to the real-time data. The compared real-time data and the adjusted physical property model, if any, may be used to prepare and submit a final application for license of the fuel a regulatory body. In addition, or in the alternative, the process may further include comparing the real-time data to the physical property model and adjusting the fuel in response to the real-time data. The compared real-time data and the adjusted fuel, if any, may be used to prepare and submit a final application for license of the adjusted fuel a regulatory body.

In various aspects, the process described herein may be useful for demonstrating parameters required for licensure of components for use in a nuclear reactor, and may include, generally, modeling at least one physical property of a component and component behavior under conditions of interest in the operation of a nuclear reactor, using the physical property and behavior modeling to prepare and submit a preliminary application for license of the component to a regulatory body responsible for approval of use of the component in a nuclear reactor, preparing component samples, placing the component samples in one or both of an experimental and a commercial nuclear reactor, placing sensors in the nuclear reactor to monitor parameters of interest during operation of the nuclear reactor, operating the nuclear reactor for a predetermined period of time, retrieving data from the sensors in the reactor in real time to measure the parameters of interest, comparing the real-time data to the physical property and component behavior models, optionally adjusting one or both of the physical property and the component behavior models to conform to the real-time data, and using the compared real-time data and the adjusted physical property and component behavior models, if any, to prepare and submit a final application for license of the component to the regulatory body. The regulatory body may be the NRC or a comparable government or civilian body authorized by a foreign country or region or by a consortium of countries and governments.

The components, in various aspects, may be nuclear fuel or a safety related component in a nuclear power plant. The parameters of interest may be selected from the group consisting of pressure, temperature, change in component volume, stress and strain tension, energy, heat capacities, thermal conductivity, fission gas release, fuel swelling, fuel melting point, and combinations thereof. The conditions of interest in the operation of a nuclear reactor include normal and accident conditions.

The sensors may be one or more of thermocouples, thermo-acoustic sensors, vacuum micro-electronic (VME) devices, spark gap transmitters, strain gauges, motion sensors, melting point sensors, neutron flux sensors, power sensors, and combinations thereof.

By eliminating the cooling, post irradiation time and report time required in conventional licensing approaches, a savings of about twelve to eighteen months can be made. In addition, because the samples are generating data in real time and non-destructively, there would be a much larger data pool, tests could be stopped if there was an indication of a malfunction and the number of tests and samples could be dramatically reduced. Since the NRC licensing pursuit would be performed in parallel with the validation testing, the time to license would be further reduced.

The approach to licensing described herein may be used for any component requiring NRC or foreign government licensing. In the case of fuel, by way of example, utilization of atomistic modeling of nuclear fuel performance, determining fuel characteristics to predict in-reactor fuel performance, and preliminary licensing with the NRC combined with real-time data retrieval to provide real time validation of the atomistic models is proposed as a new approach for licensing nuclear fuel. Similarly, in the case of a new component, the atomistic modeling looks to ways in which the new components would be expected to affect fuel performance and reactor operations.

BRIEF DESCRIPTION OF THE DRAWINGS

The characteristics and advantages of the present disclosure may be better understood by reference to the accompanying FIGURES.

FIG. 1 illustrates this approach and compares the timelines of the current and improved approach.

DESCRIPTION OF THE PREFERRED EMBODIMENTS

As used herein, the singular form of "a", "an", and "the" include the plural references unless the context clearly dictates otherwise. Thus, the articles "a" and "an" are used herein to refer to one or to more than one (i.e., to at least one) of the grammatical object of the article. By way of example, "an element" means one element or more than one element.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Further, any numerical range recited herein is intended to include all sub-ranges subsumed therein. For example, a range of "1 to 10" is intended to include any and all sub-ranges between (and including) the recited minimum value of 1 and the recited maximum value of 10, that is, having a minimum value equal to or greater than 1 and a maximum value of equal to or less than 10.

The improved testing and data gathering method will be described herein with reference to testing a new fuel, as an exemplary component to be tested for licensure purposes. The method includes generally: 1. Generating models for the new system; 2. Making samples and getting them accepted for a reactor; and 3. Testing the samples in an experimental, test or commercial reactor until the exposure time is reached for the expected cycle length of the fuel at final use.

To generate models for a new fuel system, atomic scale modeling of the fuel system using high power computing and software code that describes the behavior of fuel are employed. Suitable coding has recently become available. Suitable known high power computing systems may be used for testing nuclear fuels and other components in a nuclear reactor. In parallel with the experimental tests, the high power computing and suitable coding capabilities may be used to make preliminary license applications to the NRC to demonstrate that the use of the new fuel does not increase the risk of exposure to radioactivity to the general population over what is currently an acceptable level. The NRC looks at several parameters, such as pressure, temperature, fuel pellet swelling, and system concerns, such as the reactor and fuel rod response to changes.

In parallel with the modeling and preliminary application tasks in the first step, test samples may be designed and manufactured and the calculations required to allow them into the reactor may be performed. For example, neutronic calculations and calculations to determine if centerline melt will occur in the fuel pellet during normal and off-normal operations and to determine if the cladding will be physically challenged due to expansion of the pellet, among others may be done. For test reactors, the owner of the reactor may review the calculations before allowing its reactor to be used to test the new component. For commercial reactors, the NRC would review the calculations before allowing the new component to be tested. These tasks can still take about twelve to eighteen months to complete under the best circumstances, and may require much longer time spans where the sample to be tested is novel. Those in the nuclear power industry are familiar with the regulatory requirements. For example, requirements for approval in the United States to test and to obtain a license for commercial use are set for in Title 10 of the Code of Federal Regulations and related administrative guidelines and decisions, and governing statutes, as any of the same may be amended from time to time.

In atomistic modeling, the goal is to understand and model the behavior of each atom in the material. The collective behavior of the atoms provides an understanding of the way in which the material undergoes deformation, phase changes and other phenomena in a nuclear reactor. Molecular dynamics simulations generate information at the microscopic level, such as the atomic positions, velocities, and forces. Conversion of the microscopic information to macroscopic observable information (such as pressure, stress and strain tension, energy, heat capacities, thermal conductivity, fission gas release, fuel swelling and fuel melting point, etc.) employs statistical methods. Atomic modeling allows predictions over a broader range, as opposed to current testing and analysis, which is limited in that it is an extrapolation of specific test conditions at a specific time.

Those skilled in the art know, or can readily determine how to calculate the values of interest. For example, the ideal gas law is used to calculate fission gas release by calculating the pressure in the fuel rod and difference between the starting volume of the fuel pellets and the final volume, after swelling. Based on neutronic calculations, it is known how many fissions there should be, and one can calculate how much gas should be released. The vessel pressure is a measure of how much gas was in fact released. From the actual pressure and the change in volume, the actual fission gas release can be calculated.

Thermal conductivity is a measure of a material's ability to conduct heat, and may be shown as $$H = \frac{\Delta Q}{\Delta t} = kA\Delta T/x,$$

where $$\frac{\Delta Q}{\Delta t}$$

or q, is me raw or neat How, k is thermal conductivity, A is the total cross sectional area of the conducting surface, $\Delta T$ is temperature difference, and x is the thickness of conducting surface separating the two temperatures. Under current testing approaches, to determine thermal conductivity, k, the temperature of the centerline of the fuel pellets ($T_{centerline}$) is determined by taking apart the fuel rod, and measuring the temperature of the top pellets at the boundary and at the center. The top pellets are the hottest since the coolant flows from the bottom to the top to exit the fuel rod, increasing in temperature as in rises. The boundary temperature ($T_{surface}$) is the coolant temperature. By measuring the centerline temperature, the thermal conductivity can be determined by using the difference between centerline and boundary temperatures and multiplying by $4*k/r^2$, where q is the rate of heat generation, k is thermal conductivity, and r is the radius of the pellet.

An exemplary equation for calculating thermal conductivity in a nuclear fuel rod, using $UO_2$ as the fuel is shown below.

$$q=(T_{centerline}-T_{surface})*4*k_{UO_2}/r^2$$

$$k_{UO_2}=q*r^2/4/(T_{centerline}-T_{surface})$$

Known $r$=0.4095 cm

Measured $T_{centerline}$=2227° C.

Measured $T_{surface}$=400° C.

Measured Power=$q$=22.5 $kw$/ft=1402 $w$/cm$^3$

Calculated $k_{UO_2}$=0.032 w/cm/° C.

Similar to thermal conductivity which can be calculated using atomistic modeling and verified with measurements as above, fuel performance parameter such as, for example the percentage of fission gas released from the fuel pellet, can be measured and compared to the value predicted beforehand by atomistic modeling. Atomistic modeling involves the thermo-mechanical modelling of the heterogeneous fuel material and is based on the homogenization theory with mean-field and/or full-field approaches. The mean-field approach is a simplified geometry assumed for each phase of the heterogeneous material and spatial distributions of thermo-mechanical fields in each phases are described through mean values. Constitutive equations of a macroscopic law can be easily derived by those skilled in the art. A detailed description of the heterogeneous material is achieved within a representative elementary volume (REV) using a numerical model (finite elements or grid). The spatial distribution of thermo-mechanical fields is computed for each cell of the geometrical discretization and can be used to build a mean-field model.

Application of the REV scheme, for example, can be used to describe the grain structure of the fuel. The viscoplastic behavior of the grain aggregates strongly depends on the grain orientation. It is necessary to integrate the microstructure effects in fission gas release models and codes in order to improve the modelling of in-pile fuels. Modelling the evolution of the microstructure under in-pile or ion irradiation conditions requires populations of point defects, defect clusters and fission gas atoms and bubbles, all essential since these populations control a large number of properties and the macroscopic evolution of the material. Computer code, such as MARGARET code within the PLEIADES platform (see, Michel Freyss, *Multiscale Modelling of Nuclear Fuels under Irradiation*, Materials Innovation for Nuclear Optimized Systems Workshop, Centre of Excellence for Nuclear Materials, Dec. 5-7, 2012, Commissariat à l'energie atomique et aux energies alternatives (CEA-INSTN), Saclay, France), may be used to show that most observations are correctly simulated (e.g., gas concentration, gas release, swelling, porosity) but some phenomena are modelled empirically, e.g. bubble sink strength and bubble size distribution. A rate theory model, such as cluster dynamics may be used for as the comprehensive framework to calculate defect and defect cluster (cavities/bubbles/dislocation loops) concentrations over time, with time scale and length scale appropriate for fuel study. For intragranular phenomena, code such as the MARGARET code and cluster dynamics describe the same scales for study using cluster dynamics of intragranular fission gas behavior.

Atomic positions are not considered for spatial averaging. A set of differential equations on species concentrations may be used for calculation of defect and defect clusters (cavities/bubbles/interstitial loops) concentrations over time. For equations solved numerically, the maximum size of clusters is limited by computational resources. See S. C. Middleburgh et al., *Non-stoichiometry in $U_3Si_2$, Journal of Nuclear Materials*, Vol. 482, pp. 300-305 (2016).

When integrated with theory and experiment, modeling and simulation enhances opportunities for new insights into complex phenomena occurring in nuclear reactors, advanced modeling and simulation is recognized as having the ability to improve the performance and safety of nuclear energy. The nuclear energy advanced modeling and simulation (NEAMS) technology has relatively recently been developed and provides new tools for performance and safety improvement.

Included in the NEAMS tool kit are, among others, three fuel codes, known as MOOSE-BISON-MARMOT codes to provide advanced, multiscale fuel performance capability. MARMOT provides atomistic, mesoscale material modeling. It predicts microstructure evolution in fuel and is used with atomistic methods to develop multiscale material models. MOOSE provides a multiscale object-oriented simulation environment providing a simulation framework that allows rapid development of FEM-based applications. BISON is an advanced 3-D fuel performance code that models light water reactors, tristructural-isotropic (TRISO) and metal fuels in two and three dimensions and in steady and transient reactor operations. Other available software packages include tools for solving transport questions, reactor kinetics, isotopic depletion, fluid dynamics, thermo mechanics, structural mechanics and seismic analysis. Information about these and other simulation models are available from the U.S. Department of Energy, nuclear energy division.

BISON is applicable to a variety of fuel forms, essentially any geometry, and can be easily modified to include new material models. It can also be readily coupled to lower length scale codes such as MARMOT and thus has the potential to take a more mechanistic and less empirical approach to modeling. This allows BISON to better predict phenomena associated with advanced fuel/cladding systems where limited data may be available for verification.

BISON is a modern finite element based nuclear fuel performance code that has been under development at the Idaho National Laboratory (INL) since 2009. BISON is built using INL's Multiphysics Object Oriented Simulation Environment or MOOSE. MOOSE is a massively parallel, finite element based framework, which solves systems of coupled non-linear equations using the Jacobian-Free Newton Krylov (JFNK) method. MOOSE supports the use of one, two, and three-dimensional meshes, which allows BISON to simulate coupled multiphysics and multiscale fuel behavior in either 1D spherically symmetric, 2D axisymmetric or 3D geometries. The object-oriented architecture of the code minimizes the time and programming required to add new material and behavior models. An example of atomic modeling using BISON is described in K. E. Metzger et al., *Model of $U_3SI_2$ Fuel System Using Bison Fuel Code*, Proceedings of ICAPP, Apr. 6-9, 2014.

Several empirical or semi-empirical models of fission gas retention and release in $UO_2$ nuclear fuel have been developed. See D. A. Andersson et al., *Atomistic modeling of intrinsic and radiation-enhanced fission gas (Xe) diffusion in $UO_{2\pm x}$: Implications for nuclear fuel performance modeling*, Journal of Nuclear Materials, vol. 451, pp. 225-242 (2014); citing M. V. Speight, Nuclear Science Engineering, Vol. 37, pp. 180-185 (1969) and A. H. Booth, *A method of calculating gas diffusion from $UO_2$ fuel and its application to the X-2-f test*, Technical Report AECL, 496 CRDC-721, Atomic Energy of Canada, Ltd. (1957).

The fuel element under irradiation is submitted to a wide variety of coupled phenomena involving among others temperature, mechanical load, radiation damage, chemical interaction between the material and the fission products. Another modeling code is provided by the PLEIADES fuel performance software environment developed by CEA, which can predict the behavior of standard or innovative fuel elements under various operating conditions. Basic research on fuel materials focuses on the evolution under irradiation of the microstructure, the transport properties of defects, fission products, helium, as well as their thermochemistry. The overall strategy for a multiscale modeling scheme of nuclear fuels. First-principles electronic structure calculations used to get insight into the atomic transport properties of point defects and classical molecular dynamics may be used to model the ballistic damage created by the recoil of fission products (see G. Martin, P. Garcia, L. Van Brutzel, B. Dorado, S. Maillard, *Nuclear Instruments and Methods*, Physics Research B 269, 1727 (2011)). The multiscale modeling approach will be coupled with testing during cycle time exposure. Separate effects experiments are guides to inform modeling, and provide tools to validate the approximations of the modeling methods.

The process of fission produces a range of fission products, the smaller nuclei produced when a heavy isotope splits, most often after a neutron capture. These fission products increase in concentration within the fuel as burn-up of the fissile material progresses. In the high burn-up rim region of $UO_2$ pellets, a restructuring of the material occurs, named high burn-up structure. In $UO_2$, this restructuring is characterized by sub-micron sized grains with high porosity. See I. Ray, H. Matzke, H. Thiele and M. Kinoshita, Journal of Nuclear Materials, vol. 245, no. 2-3, pp. 115-123, (1997).

In order to assess an isotopic composition of the fuel pellet at various distances from the pellet center, a single pin cell model was created in the deterministic, 2D geometry, code HELIOS. HELIOS allows for solving the neutron transport equation while also performing fuel burn-up calculations. The U:Si ratio as a function of burn-up has been calculated as a function of burn-up at different radii from the center of the pellet to the pellet periphery (up to 60 MWd/kgU) using HELIOS. HELIOS has been successfully used to model the stoichiometry variation and the fission product concentration in $U_3Si_2$ as a function of burn-up in light water reactor conditions.

In the third step, the samples may be tested in either a test reactor or a commercial reactor until the exposure time is reached for the expected cycle length at final use under normal operating conditions. If the samples are in a commercial reactor, the exposure time is at least eighteen to twenty-four months, the typical cycle length for fuel use. If the tests are carried out in a test reactor, this ultimate time span may be longer if the wait time to gain access to the test reactor is factored in. The actual run time for the reactor to match as closely as possible to normal reactor cycle times would be about eighteen to twenty-four months.

The new samples may preferably be made while incorporating various probes and/or sensors and monitors in the test reactor that allow real-time monitoring and transmission of the data from a fuel rod to a data receiver for instantaneous analysis. Thermo-couples may be used to measure temperature at various stages in the reactor exposure cycle. In various aspects, another suitable monitor may be a thermo-acoustic sensor (TAS). TAS is a device that produces sound waves of an assigned frequency, proportional to temperature, with an amplitude (i.e., loudness) proportional to the fission heat input without a need for applied electrical power or signal transmission cables. Acoustic output signals are measured outside the reactor vessel. TAS monitors may be placed inside the reactor core. For example, multiple TAS monitors may be placed inside the instrumentation thimble in every fuel assembly, each operating at a specific frequency. The use of TAS improves operating power margins by enabling a continuous 3-D power distribution measurement. TAS monitors are passively "powered" by heat induced by gamma or neutron flux (electrically-heated stack in our case). Gas in the resonance chamber is heated and generates oscillating pressure waves with frequency and amplitude dependent upon the operating conditions experienced by the TAS device itself (heat flux and temperature). The pressure waves are transmitted outside of the resonator and are measured by an ad-hoc network of receivers (such as, accelerometers), which are mounted on the outside of the reactor vessel.

A thermoacoustic software package, commercially available under the mark DeltaEC, may be used to predict amplitude and frequency of the acoustic signal generated by the resonator. The TAS body vibrations predicted by the DeltaEC model are then used as input conditions in a coupled structural-acoustic finite-element model of the vessel. The results of a set of simulations include the vibration anticipated on the outside wall of the vessel. Those skilled in the art can create similar software to monitor sensor data, analyze the data, and predict component properties during continued operation of the reactor.

Other monitors may include vacuum micro-electronic (VME) devices and spark gap transmitters. VME devices include radiation and temperature tolerant electronics capable of being configured as an oscillator or multi-stage wireless transmitter circuit. Thermionic vacuum devices, in which charge transport through the vacuum is accomplished by thermonically emitted electrons, are well suited for extreme environments due to their intrinsic internal high temperature operation and radiation hardness.

Spark gap transmitters consist of simple induction capacitance network and produce a pulsed signal with a period equal to the time it takes for a first capacitor to be charged by a self-powered neutron flux detector. A signal is transmitted through an antenna when the voltage across a first capacitor is greater than the breakdown voltage of the spark gap device. Each transmitted pulse can carry up to four pieces of information based on its transmission frequency, pulse interval, modulated frequency, and damped decay rate. A variety of fuel parameters can be measured and the measurements can be translated to the various pulse parameters of each device. The pulse transmission frequency is selectable and will be different on each device allowing many hundreds of such devices to operate concurrently. Information emitted from the transmitters is received at discrete times (not continuously), typically once per second.

Alternatively, monitoring may be accomplished between refueling outages in a non-destructive manner utilizing remote means such as gamma ray tomography. Combined with real-time data such as centerline fuel temperatures that can be used to determine the thermal conductivity of the fuel, fuel rod pressure that can be used to determine fission gas release and pellet stack height that can be used to determine axial swelling, the predictions based on the models can be verified or if the values are different, the models can be changed to better represent the actual values.

The difference at this step from the current approach is that the test data will be available on a real time basis, rather than waiting for the completion of the fuel cycle time. FIG. 1 illustrates the new testing approach and compares the timelines of the current and improved approaches. The data can be used as soon as it is received to validate the atomic scale models used in the preliminary licensing applications. If the data does not match predictions, then the models can be re-evaluated and new models generated to incorporate the actual data from the ongoing tests and new predictions made as to future data readings which can then be used to validate or invalidate the new models.

The new approach preferably also includes communication with the NRC at a much earlier time in the process than can currently occur because the test date is available for analysis and review much faster, and additional testing requests may be complied with in the first test reactor cycle rather than waiting for completion of the cycle and then having to begin a new testing cycle. Presuming that validation is finally achieved; the models for the new system and the license application can be approved by the NRC at the completion of the first in-reactor testing, without the need for a second round of in-reactor testing.

In addition to considerable time savings, by several years, fewer samples will need to be made and tested. For instance, if data recovered at 6, 12, 18 and 24 months is required, instead of the making 4 samples (presuming no duplicates are required), only one sample is needed since the data can be obtained at all the data points without destructive examination of the sample. Also, if a sample is failing, the failure will be recognized early in the experimental period and a new sample can then be made to replace the failed sample with a minimum of lost experimental time. Finally, the NRC will preferably be involved from the early stages of the work and will have the ability to point out issues of concern early in the product development and testing stage, thereby reducing the time involved in repeating experiments at different conditions.

This concept combines (1) real-time data transmission from inside operating nuclear fuel using wireless or wired transmission or remote sensing and (2) atomic scale modeling to dramatically impact the cost and time involved in testing and licensing processes. The proposed method of testing enables a new approach to the NRC where the NRC can make requirements changes in real time in light of real time test data and modelling predictions with a more rigorous background than a collection of data points.

This approach to testing and licensing will reduce time, development costs and increase the returns on investment involved in generating and commercializing new fuel and other nuclear component concepts. For instance, the manufacture of six fuel pins for testing in a recent program consumed millions of private industry and government dollars and took two years. Then, the manufacture and testing times ranged from four to eight years. The final costs will be much higher. If at the end of the development process, the NRC wants additional testing and data, or if the data does not come out well, then the development process must be repeated. As the length of time between the start of the development and the product introduction increases, the return on investment decreases due to the discount rate over time, so much so that it makes introduction of more than the most trivial of change almost economically impossible. By dramatically shortening the testing time and decreasing the risks involved in having to repeat testing and delay new product introduction, the proposed new testing and licensure method increases the likelihood of introducing new technology in an economically sound way, and incremental improvements in safety have a much greater chance of reaching commercial application.

The present invention has been described in accordance with several examples, which are intended to be illustrative in all aspects rather than restrictive. Thus, the present invention is capable of many variations in detailed implementation, which may be derived from the description contained herein by a person of ordinary skill in the art.

All patents, patent applications, publications, or other disclosure material mentioned herein, are hereby incorporated by reference in their entirety as if each individual reference was expressly incorporated by reference respectively. All references, and any material, or portion thereof, that are said to be incorporated by reference herein are incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A process for demonstrating parameters required for licensure of components for use in a nuclear reactor comprising:
   preparing a computer generated atomistic model of at least one physical property of a component and a computer generated model predicting the behavior of the component under conditions of interest in the operation of a nuclear reactor;
   preparing and submitting a preliminary application for license of the component to a regulatory body responsible for approval of use of the component in a nuclear reactor based on the computer generated physical property and behavior models;
   placing at least one component samples in a nuclear reactor;
   placing sensors in the nuclear reactor to monitor parameters of interest during operation of the nuclear reactor;
   operating the nuclear reactor for a predetermined reactor cycle time;
   retrieving data from the sensors in the reactor in real time during the cycle time for instantaneous analysis of the parameters of interest;
   comparing the real-time data to the physical property and component behavior models;
   applying the compared real-time data and physical property and component behavior models to (i) validate the models and component predictions based on the models when the retrieved real-time data conforms to the model predictions, or (ii) adjusting the computer generated models and component predictions to incorporate and conform to the retrieved real-time data during and prior to completion of the reactor cycle time when the retrieved real-time data does not conform to the model predictions;
   when adjusted computer generated models and component predictions are generated, repeating the data retrieving, comparing real-time data and using the compared real-time data steps during the cycle time until the models and component behavior predictions are validated;
   communicating with the regulatory body to advance and complete the application for license of the component during and prior to completion of the cycle time based on the validated real-time data and physical property and component behavior models.

2. The process recited in claim 1 wherein the component is nuclear fuel.

3. The process recited in claim 1 wherein the component is a safety related component in a nuclear power plant.

4. The process recited in claim 1 wherein the parameters of interest are selected from the group consisting of pressure, temperature, change in component volume, stress and strain tension, energy, heat capacities, thermal conductivity, fission gas release, fuel swelling, fuel melting point, and combinations thereof.

5. The process recited in claim 1 wherein the conditions of interest in the operation of a nuclear reactor are selected from normal and accident conditions and combinations thereof.

6. The process recited in claim 1 wherein the sensors are selected from the group consisting of thermocouples, thereto-acoustic sensors, vacuum micro-electronic devices, spark gap transmitters, strain gauges, motion sensors, melting point sensors, neutron flux sensors, power sensors, and combinations thereof.

* * * * *